United States Patent [19]

Horie

[11] Patent Number: 5,568,464
[45] Date of Patent: Oct. 22, 1996

[54] SEMICONDUCTOR LASER DRIVING APPARATUS UTILIZING THREE CURRENT SOURCES TO CONTROL READ AND WRITE LIGHT POWER

[75] Inventor: Yuji Horie, Tokyo, Japan

[73] Assignee: Olympus Optical Co., Ltd., Tokyo, Japan

[21] Appl. No.: 343,852

[22] Filed: Nov. 17, 1994

[30] Foreign Application Priority Data

Nov. 18, 1993 [JP] Japan ................................ 5-289348

[51] Int. Cl.$^6$ .............................. G11B 7/00; H01S 3/133
[52] U.S. Cl. ............................................. 369/116; 372/38
[58] Field of Search ................................ 369/44.29, 116, 369/44.26; 372/38, 31, 29

[56] References Cited

U.S. PATENT DOCUMENTS

| | | | |
|---|---|---|---|
| 4,855,988 | 8/1989 | Shinbayashi et al. | 369/116 |
| 4,912,714 | 3/1990 | Hatanaka et al. | 372/31 |
| 5,175,722 | 12/1992 | Minami et al. | 369/116 |
| 5,224,112 | 6/1993 | Uesaka | 372/38 |
| 5,276,671 | 1/1994 | Minami et al. | 369/116 |
| 5,400,313 | 3/1995 | Belser et al. | 369/116 |
| 5,513,197 | 4/1996 | Koishi | 369/116 |

FOREIGN PATENT DOCUMENTS

| | | | |
|---|---|---|---|
| 1-302788 | 12/1989 | Japan. | |
| 4-157632 | 5/1992 | Japan. | |
| 6-85362 | 3/1994 | Japan | H01S 3/096 |
| 06310784 | 11/1994 | Japan. | |

Primary Examiner—Georgia Y. Epps
Assistant Examiner—Kim-Kwok Chu
Attorney, Agent, or Firm—Armstrong, Westerman, Hattori, McLeland & Naughton

[57] ABSTRACT

A semiconductor laser driving apparatus for use in an information recording/reproducing apparatus that records and reproduces information by illuminating a medium with a laser beam. The semiconductor laser driving apparatus includes a semiconductor laser for generating the laser beam, a photo detector for detecting the output of the semiconductor laser, a first current source for generating a base optical power of the output of the semiconductor laser wherein the base optical power is used in recording information, a second current source for adjusting a reproducing optical power of the output of the semiconductor laser wherein the reproducing optical power is used to reproduce information, a third current source for adjusting a recording optical power of the output of the semiconductor laser wherein the recording optical power is used in recording information, and an optical power control circuit for controlling the optical output power of the semiconductor laser in such a manner that the reproducing optical power used to reproduce information is generated by the sum of a current provided by the first current source and a current provided by the second current source, the recording optical power used to record information is generated by the sum of the current provided by the first current source and a current provided by the third current source, and the base optical power used to record information is generated by the current provided by the first current source.

13 Claims, 11 Drawing Sheets

5,568,464

SEMICONDUCTOR LASER DRIVING APPARATUS UTILIZING THREE CURRENT SOURCES TO CONTROL READ AND WRITE LIGHT POWER

BACKGROUND OF THE INVENTION

1. Field of the Invention

The present invention relates to a semiconductor laser driving apparatus for use in an optical information recording/reproducing apparatus, which can control the optical output power level of a semiconductor laser precisely at a desired level.

2. Description of the Related Art

It is well-known to use a semiconductor laser as a light source of an optical head installed in an optical information recording/reproducing apparatus which records and reproduces information by illuminating an optical recording medium with a light beam.

Semiconductor lasers for a light source of an optical head are required to provide a stable optical output power level that is maintained constant relative to a reference level so as to achieve good stability in recording/reproducing data. One of the known techniques for this purpose is disclosed in Japanese Patent Laid-Open No. 1-302788.

FIG. 1 illustrates the configuration of the semiconductor laser driving circuit disclosed in the prior art reference cited above. This laser driving circuit includes a feedback loop C for coarse adjustment of the laser output power level, and a feedback loop D for fine adjustment of the laser output power level.

The feedback loop includes a semiconductor laser 51, a photodiode 52 for monitoring the optical output, a resistor 55, a comparator 53 for comparing the output of the photodiode 52 with a reference value, an up/down counter 61 for counting the output of the comparator 53 in response to a clock signal provided by an oscillator 62, a digital-to-analog converter 60 for converting the output of the up/down counter 61 to an analog voltage value; a current source 54 that operates under the control of the digital-to-analog converter 60, and a switch 56. The current source 54 provides a current (threshold current) required for the semiconductor laser 51 to start a lasing operation and to emit light at a predetermined level less than a final target value.

The feedback loop D has a configuration similar to that of the loop C, and includes the semiconductor laser 51, the photodiode 52, the resistor 55, a comparator 64, an up/down counter 66; a digital-to-analog converter 65; a current source 63; and a switch 56. The output current of the current source 63 is added to the output of the current source 54 so that the total current allows the semiconductor laser 51 to increase the output level from the above-described predetermined level to the final target value.

In these loops, the output current of the current source 63 produced by one bit at the least significant bit of the input of the digital-to-analog converter 65 is set to a value smaller than the output current of the current source 54 produced by one bit at the least significant bit of the input of the digital-to-analog converter 60.

In this semiconductor laser driving circuit, when the operation of the semiconductor laser is started, the laser output power level is coarse-adjusted to the predetermined level by using the feedback loop C, and then fine-adjusted to the final target value by using the feedback loop D. Thus, the output power level of the semiconductor laser is precisely controlled at the target value.

However, in this driving circuit, after the output power of the semiconductor laser is set to the target value, the change in the supply current required to maintain the output power of the semiconductor laser at the target value is provided by the feedback loop D. This means that the feedback loop D has to provide not only the current corresponding to the difference between the target value and the above-described predetermined level but also the current required for the compensation of the change in the threshold current and the laser efficiency. To make compensation for such a large variation in the current, a large current is required to flow through the feedback loop D. As a result, it becomes difficult to have a small output current of the current source 63 that is produced by one bit at the least significant bit of the input of the digital-to-analog converter 65. This means that the accuracy in the adjustment of the laser output power is degraded. If the laser output power determined by the feedback loop C is set to a base optical power level during a recording operation (corresponding to recording data "0"), the base optical power level will change with the change in the threshold current.

To solve the above problems, the inventor of the present invention has proposed a semiconductor laser driving technique that can provide higher accuracy in the control of the laser output power, as disclosed in Japanese Patent Application No. 5-95901. FIG. 2 illustrates the configuration of this semiconductor laser driving circuit.

This laser driving circuit includes a feedback loop A for coarse adjustment of the laser output power level, and a feedback loop A for fine adjustment of the laser output power level.

The feedback loop A includes a digital-to-analog converter 73 for coarse adjustment, a voltage-to-current converter 74 for converting the output voltage of the digital-to-analog converter 73 to a current, a semiconductor laser 71; a photodiode 72 for monitoring the laser output of the semiconductor laser 71, a current-to-voltage converter 75 for converting the output current of the photodiode 72 to a voltage; an analog-to-digital converter 76 for converting the output of the current-to-voltage converter 76 to a digital value, and a signal processing circuit 79 for detecting the output of the analog-to-digital converter 76 and setting the input of the digital-to-analog converter 73 to a value corresponding to the detected value.

The feedback loop B includes a digital-to-analog converter 77 for fine adjustment, a voltage-to-current converter 78 for converting the output voltage of the digital-to-analog converter 77 into a current, the semiconductor laser 71; the photodiode 72; the current-to-voltage converter 75, the analog-to-digital converter 76, and the signal processing circuit 79 for detecting the output of the analog-to-digital converter 76 and setting the input of the digital-to-analog converter 77 to a value corresponding to the detected value.

In these feedback loops, the ratio of the resolution of the feedback loop A to that of the feedback B, that is the ratio of the minimum change in the output current of the voltage-to-current converter 74 produced by a one-bit change at the least significant bit of the digital-to-analog converter 73 to the minimum change in the output current of the voltage-to-current converter 78 produced by a one-bit change at the least significant bit of the digital-to-analog converter 77, is set to n.

Referring to FIG. 3, the operation of controlling the laser output power according to the above-described laser driving circuit will be described below. The upper part of FIG. 3 illustrates the dependence of the optical output power of a semiconductor laser on the supply current (forward current), and the lower part of FIG. 3 illustrates the change in the supply current. At the beginning of the driving operation of a semiconductor laser by the above-described laser driving circuit, the optical output is controlled in two steps during a time period denoted by $T_1$ in FIG. 3. In the first step, the feedback loop A adjusts the output of the analog-to-digital converter 76 to a value $m_1$ which allows the laser to produce an optical output power of $P_{01}$. In the second step after that, the feedback loop B adjusts the output of the analog-to-digital converter 76 to a value $m_2$ which allows the laser to produce an optical output power of $P_{02}$.

After that, the semiconductor laser operates under automatic output power control (APC) conditions. If the laser output power deviates from an operating state "a" shown in FIG. 3 to another state "b" or "c", the laser output power is adjusted during time periods $T_1$ and $T_2$ of FIG. 3 according to the following steps. First, the feedback loop B changes the supply current so as to finely adjust the laser output power to the original value. If the output of the feedback loop B has changed to a value greater than the original output by an amount of n as a result of the above adjustment, then the output of the feedback A is changed by an amount of 1, and furthermore the output of the feedback B is returned to its original value.

In this technique of controlling the laser output power, the fine adjustment range that should be covered by the feedback loop B is narrower than that required for the above-described laser driving circuit shown in FIG. 1. This means that this laser driving technique can provide better accuracy in controlling the laser output power.

In this technique, since compensation for variations in current due to variations in the threshold current or laser efficiency is made by both feedback loops A and B, a smaller current is required in the feedback loop B, and thus it is possible to control the laser output power to a target value more accurately. However, there is no disclosure about a technique to control the laser output power at two or more different target values. If the output power level determined by the feedback loop A is set to a value equal to the base power level during a recording operation, then the resolution of the base optical power level is determined by the driving current corresponding to the voltage determined by the least significant bit of the analog-to-digital converter 73. Therefore, when recording optical power (corresponding to recording data "1") is added to the above base optical power, deviations occur during the process of replacing the variation of the feedback loop B with the variation of the feedback A, wherein the deviations depend on the resolution of the base optical power level.

In information recording/reproducing apparatus for recording/reproducing information on an optical recording medium, it is required to precisely control different optical power levels: the reproducing optical power used to reproduce information, the recording optical power (corresponding to recording data "1") used to record information, and the base optical power (corresponding to recording data "0").

However, as described above, in conventional semiconductor laser driving techniques such as those described in FIGS. 1 and 2, it is impossible to control the output power level for a plurality of target values, whereas it is possible to accurately control the optical power level for a single target value. This means that conventional techniques cannot provide accurate control for all optical power levels including the reproducing optical power, recording optical power, and base optical power levels.

SUMMARY OF THE INVENTION

It is an object of the present invention to provide a semiconductor laser driving apparatus capable of accurately controlling all optical power levels including recording optical power, base optical power, and reproducing optical power levels at respective target values required for recording or reproducing information in an information recording/reproducing apparatus.

It is further object of the present invention to provide a semiconductor laser driving apparatus having the capability of separately controlling recording optical power, base optical power, and reproducing optical power levels at respective target values required for recording or reproducing information in an information recording/reproducing apparatus, wherein the optical power level of each mode can be corrected without influencing optical power levels of other modes.

It is another object of the present invention to provide a semiconductor laser driving apparatus in which smaller currents are required for both feedback loops for correction of reproducing and recording optical power levels thereby improving the accuracy of each feedback loop and thus also the accuracy of control of reproducing and recording optical power levels.

It is still another object of the present invention to provide a semiconductor laser driving apparatus in which the change in a feedback loop for correcting the reproducing optical power level can be replaced by the change in a feedback loop for correcting the base optical power level, thereby improving the accuracy in controlling the base optical power level.

To achieve the above objects, the present invention provides a semiconductor laser driving apparatus for use in an information recording/reproducing apparatus that records and reproduces information by illuminating a medium with a laser beam, the semiconductor laser driving apparatus comprising a semiconductor laser for generating the laser beam; a photo detector for detecting the output of the semiconductor laser, a first current source for generating a base optical power of the output of the semiconductor laser wherein the base optical power is used in recording, a second current source for adjusting a reproducing optical power of the output of the semiconductor laser wherein the reproducing optical power is used to reproduce information, a third current source for adjusting a recording optical power of the output of the semiconductor laser wherein the recording optical power is used to record information, and an optical power control circuit that controls the optical output power of the semiconductor laser, wherein the reproducing optical power used to reproduce information is generated by the sum of a current provided by the first current source and a current provided by the second current source, the recording optical power used to record information is generated by the sum of the current provided by the first current source and a current provided by the third current source, and the base optical power used in recording information is generated by the current provided by the first current source. Other aspects, features, and advantages of the invention will become more apparent from the following description with reference to the accompanying drawings.

BRIEF DESCRIPTION OF THE DRAWINGS

FIGS. 4–9 relate to a first embodiment of the present invention, wherein:

FIG. 4 is a block diagram illustrating a general configuration of a semiconductor laser driving apparatus;

FIG. 5 is a graph illustrating the relationship between the driving current of a semiconductor laser and its optical output power;

FIG. 6 illustrates optical output power levels during reproducing, erasing, and recording operations, as well as on/off-states of feedback loops;

FIGS. 7 and 8 are flow charts illustrating the operation of controlling the optical output power according to the first embodiment;

FIG. 9 illustrates a control process of the optical output power level for the case where the optical output power level of a semiconductor laser increases with time; FIGS. 11 through 14 relate to a second embodiment of the present invention, wherein:

FIG. 11 is a block diagram generally illustrating the configuration of a semiconductor laser driving apparatus;

FIG. 12 is a graph illustrating the relationship between the driving current of a semiconductor laser and its optical output power;

FIG. 13 illustrates optical output power levels during reproducing, erasing, and recording operations, as well as on/off-states of feedback loops; and FIG. 14 is a flow chart illustrating the operation of controlling the optical output power according to the second embodiment.

DETAILED OF THE PREFERRED EMBODIMENTS

Figure 1:
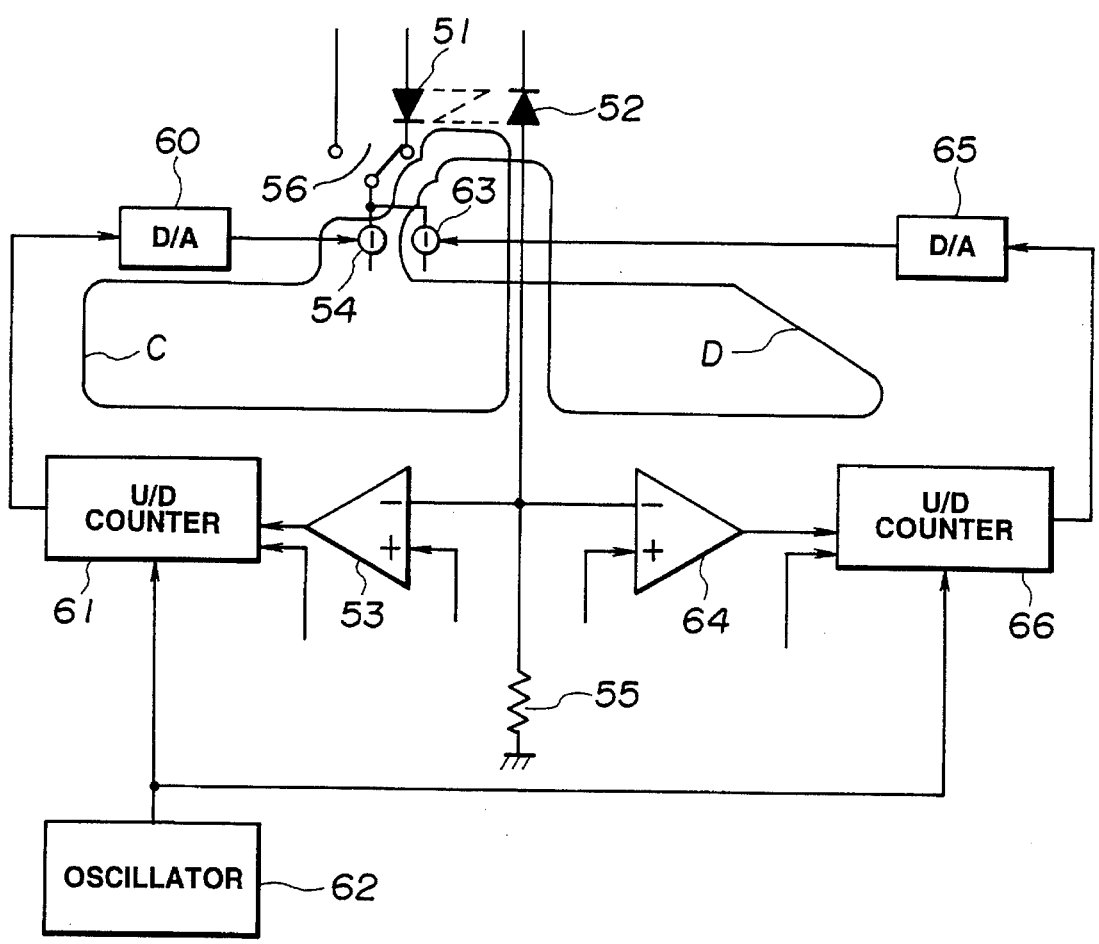
FIG. 1 is a schematic diagram illustrating an example of a conventional semiconductor laser driving apparatus.
Figure 2:
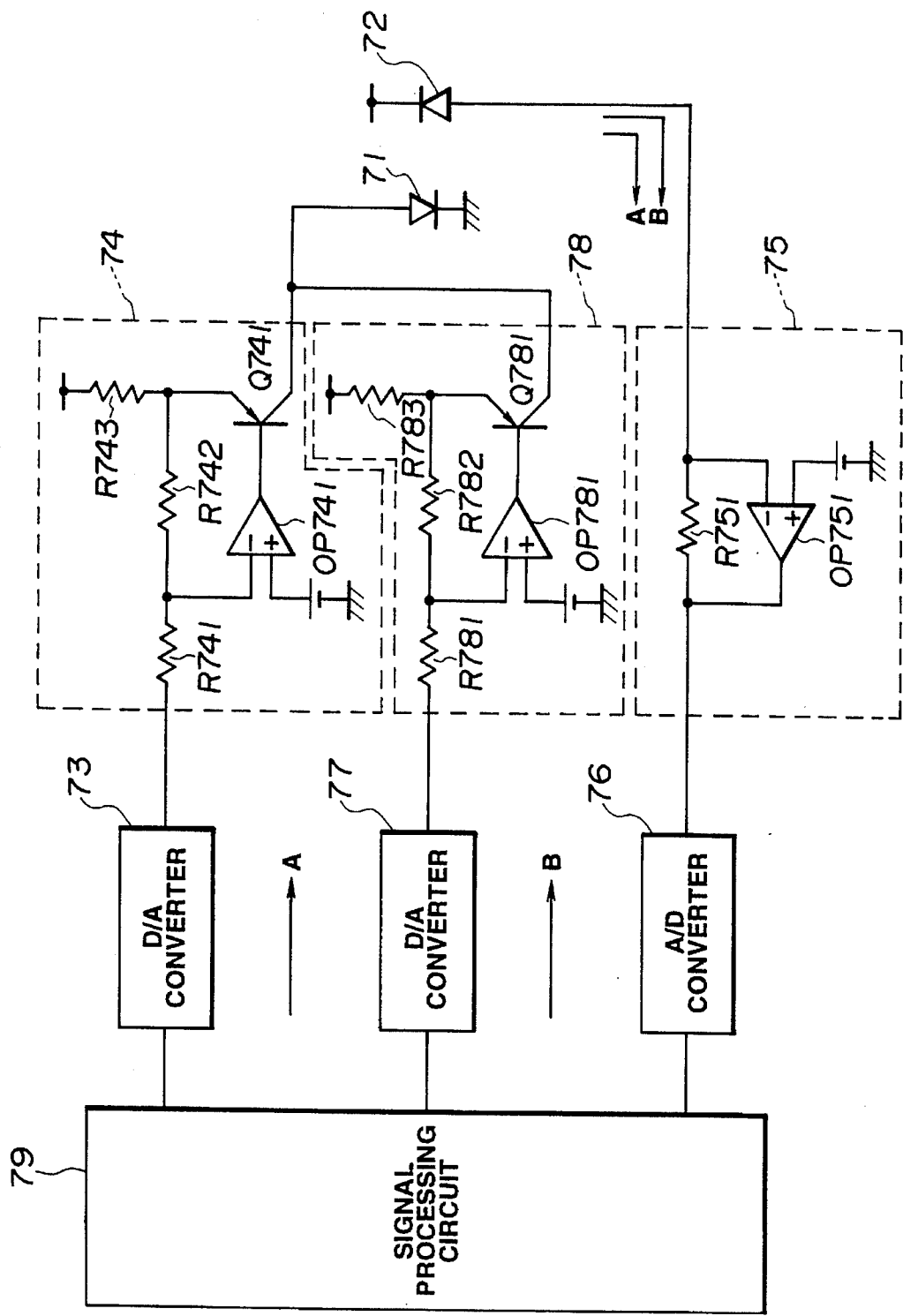
FIG. 2 is a schematic diagram illustrating another example of a well-known semiconductor laser driving apparatus.
Figure 3:
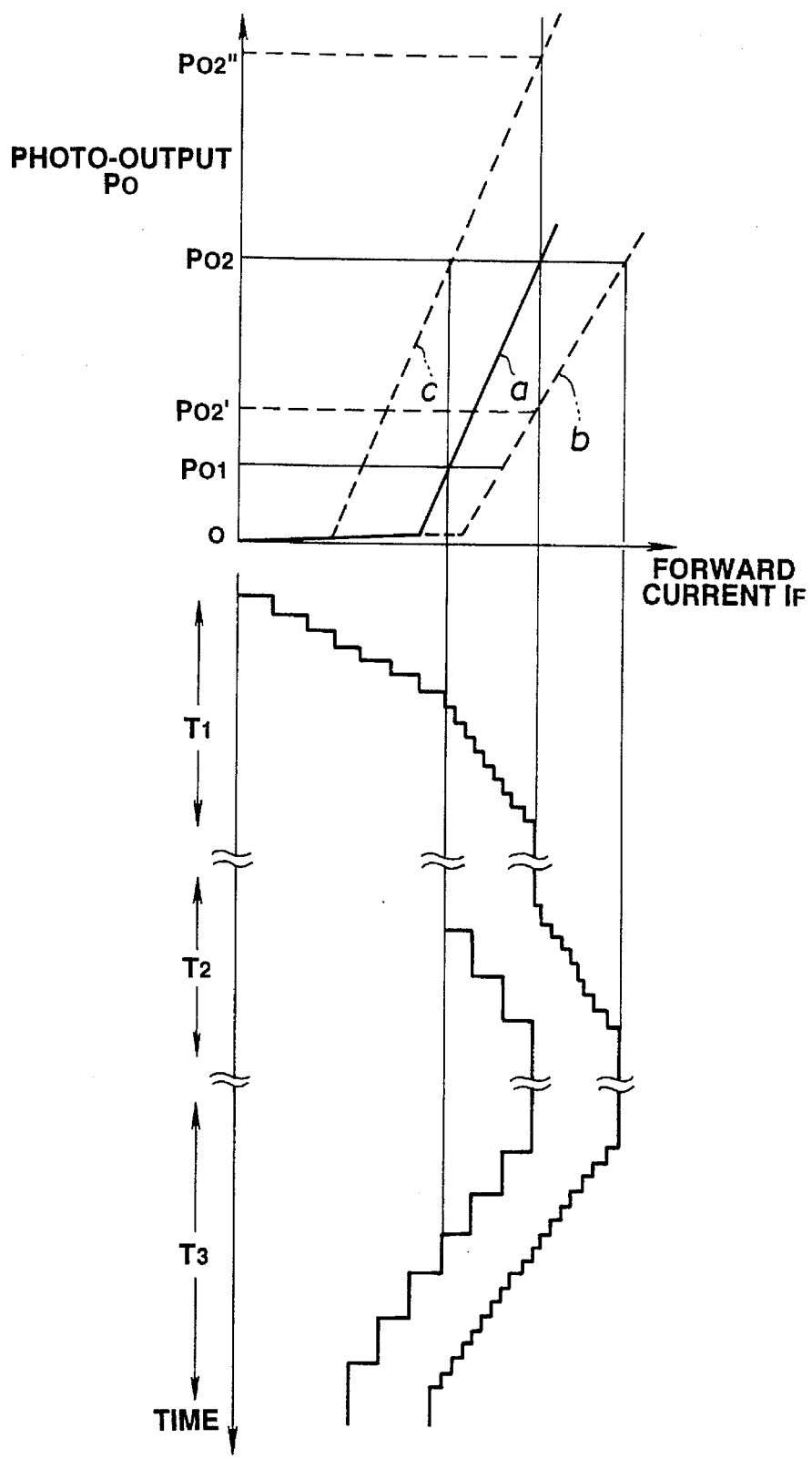
FIG. 3 illustrates the operation of controlling an optical power level according to the technique shown in FIG. 2.

Referring to FIGS. 4–9, a first embodiment of the present invention will be described below.

A semiconductor laser driving apparatus according to this embodiment comprises a semiconductor laser 11, a photodiode 12 acting as a photo detector for monitoring the optical output power of the semiconductor laser 11, and three negative feedback loops including a feedback loop a acting as a first current source for generating and adjusting base optical output power $P_b$ (corresponding to recording data of "0" during a recording operation) of the semiconductor laser 11, a feedback loop b acting as a second current source whose output is added to the output of the feedback loop a so as to generate and adjust reproducing optical output power Pr of the semiconductor laser 11, and a feedback loop c acting as a third current source whose output is added to the output of the feedback loop a so as to generate and adjust recording optical output power $P_w$ (corresponding to recording data of "1" during a recording operation) of the semiconductor laser 11.

The feedback loop a controls the base optical power $P_b$ during a recording operation, and comprises a base-optical-power digital-to-analog converter (D/A converter) 1 for specifying a current for the control of the base optical power $P_b$, a voltage-to-current converter (V-I converter) 4 for converting the output voltage of the digital-to-analog converter 1 into a current $I_1$, an adder 7 for producing the sum $I_{br}$ of $I_1$ and an output $I_2$ of a voltage-to-current converter 5, an adder 8 for producing the sum I of $I_{br}$ and an output $I_3$ of a voltage-to-current converter 6, the semiconductor laser 11 to be controlled according to the level of the output current I of the adder 8, the photodiode 12 for monitoring the optical output power of the semiconductor laser 11, a current-to-voltage converter (I-V converter) 9 for converting the output of the photodiode 12 into a voltage form, an analog-to-digital converter (A/D converter) 10 for converting the output voltage of the current-to-voltage converter 9 into a digital value A, and a signal processing circuit 13 for controlling the output of the digital-to-analog converter 1 according to the output of the analog-to-digital converter 10.

The feedback loop b controls the reproducing optical power $P_r$, and comprises a reproducing-optical-power digital-to-analog converter 2 for specifying a current provided for the control of the reproducing optical power $P_r$, the voltage-to-current converter 5 for converting the output voltage of the digital-to-analog converter 2 into the current $I_2$, a switch SW1 for controlling the adding operation of the adder 7 to produce the sum of the output $I_2$ of the voltage-to-current converter 5 and the output $I_1$ of the voltage-to-current converter 4, the adder 7, the adder 8, and semiconductor laser 11, the photodiode 12, the current-to-voltage converter 9; the analog-to-digital converter 10; and the signal processing circuit 13 for controlling the output of the digital-to-analog converter 2 according to the output of the analog-to-digital converter 10.

The feedback loop c controls the recording optical power $P_w$ during a recording operation, and comprises a recording-optical-power digital-to-analog converter 3 for specifying a current for the control of the recording optical power $P_w$, the voltage-to-current converter 6 for converting the output voltage of the digital-to-analog converter 3 into the current $I_3$, a switch SW2 for controlling the adding operation of the adder 8 to produce the sum of the output $I_3$ of the voltage-to-current converter 6 and the output $I_{br}$ of the adder 7, the adder 8, the semiconductor laser 11, the photodiode 12, the current-to-voltage converter 9, the analog-to-digital converter 10; and the signal processing circuit 13 for controlling the output of the digital-to-analog converter 3 according to the output of the analog-to-digital converter 10.

In the above circuit configuration, the output current I of the adder 8 is supplied as a driving current to the semiconductor laser 11, and the optical output power of the semiconductor laser 11 is detected by the photodiode 12 so as to obtain the detected optical output power level A at the output of the analog-to-digital converter 10 via the current-to-voltage converter 9.

The signal processing circuit 13 outputs a write gate signal WG that specifies the laser driving mode for generating the reproducing optical power $P_r$, the base optical power $P_b$, or the recording optical power $P_w$, and also outputs a write data signal WD. The signals processing circuit 13 also receives signals from a recording-control signal processing circuit (not shown) that performs automatic output power control of the reproducing optical power $P_r$. These signals are an erase/write signal E/W that designates either an erasing or writing operation, a write gate signal $W_{GATE}$ that designates either an operation at the recording optical power level or an operation at the erasing optical power level, and a write data signal $W_{DATA}$ that has on- and off-levels depending on data to be recorded.

There are also provided AND circuits 14 and 15, an OR circuit 16, and a NOR circuit 17, wherein WG and WD are input to the AND circuit 14i $W_{GATE}$ and $W_{DATA}$ are input to the AND circuit 15, and WG and $W_{GATE}$ are input to the NOR gate 17. The output of the AND circuit 14 and the output of the AND circuit 15 are input to the OR circuit 16. The output of the NOR circuit 17 is provided to the switch SW1 as its control signal, and the output of the! OR circuit 16 is provided to the switch SW2 as its control signal.

These elements including the signal processing circuit 13, the AND circuit 14, 15, the OR circuit 16, the NOR circuit 17, and the switches SW1 and SW2 form laser output power control means.

The switch SW1 is controlled by the write gate signal WG from the signal control circuit 13 and the write gate signal $W_{GATE}$ from the recording-control signal processing circuit (not shown) such that the switch SW1 is turned on when WG=$W_{GATE}$= OFF, and turned off When WG=ON or $W_{GATE}$=ON. When the switch SW1 is in an on-state, the semiconductor laser 11 generates optical output power at the reproducing optical power $P_r$. If the switch SW1 is an off-state, the semiconductor laser 11 generates optical output power at either the base optical power $P_b$ or the recording optical power $P_w$, depending on the state of the switch SW2.

The switch SW2 is controlled by the write gate signal WG and the write data signal from the signal control circuit 13 and the write gate signal $W_{GATE}$ and the write data signal $W_{DATA}$ from the recording-control signal processing circuit (not shown) such that the switch SW2 is turned on when WG=WD=ON or $W_{GATE}$=$W_{DATA}$=ON, and turned off when WG=ON and WD=ON, or $W_{GATE}$=ON and $W_{DATA}$=OFF. When the switch SW1 is in an off-state, if the switch SW2 is in an on-state then the -semiconductor laser 11 generates optical output power at the recording optical power $P_w$, however if the switch SW2 is in an off-state then the semiconductor laser 11 generates optical output power at the base optical power $P_b$.

Figure 5:
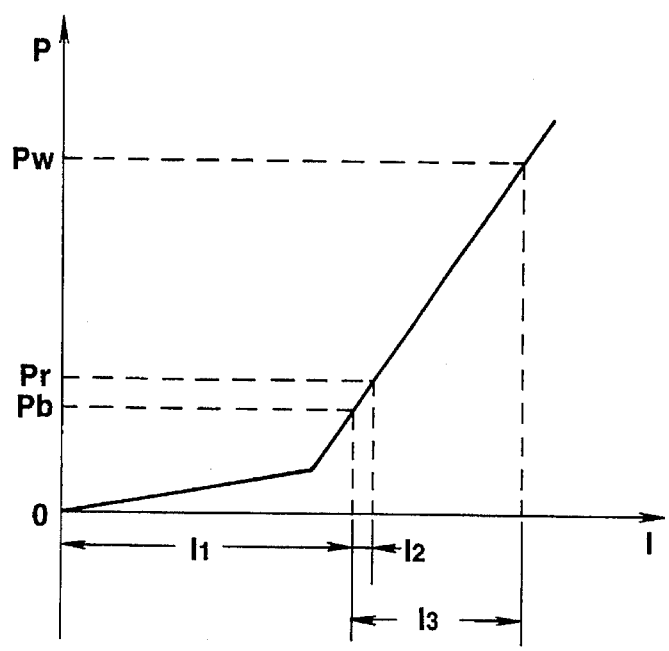
Figure 6:
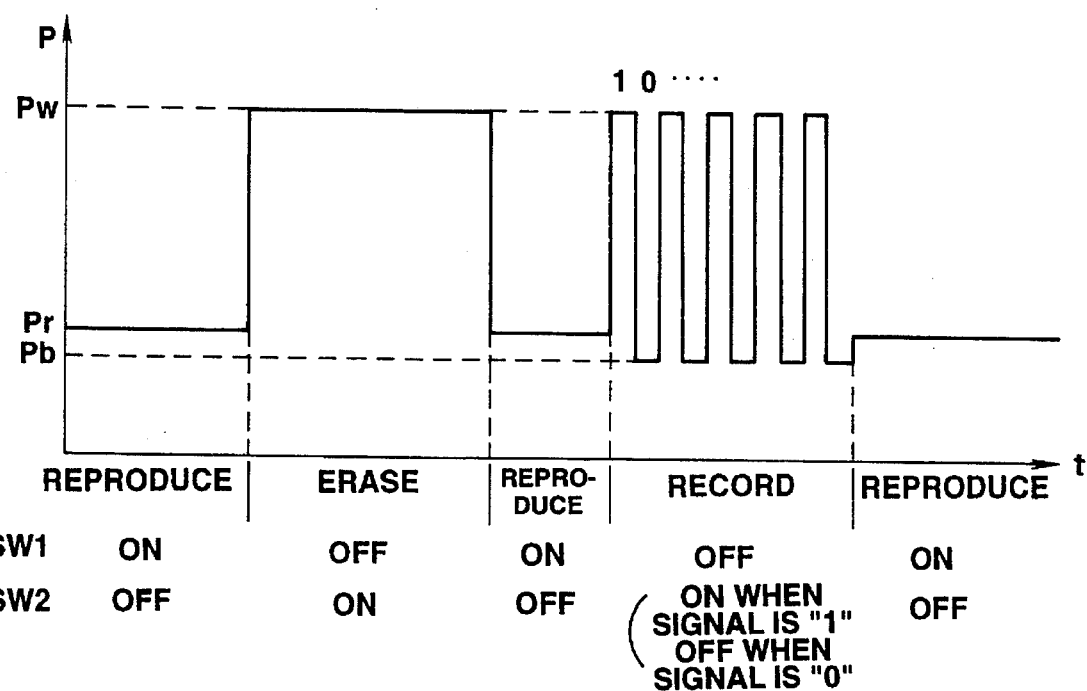

FIG. 5 illustrates the relationship between the driving current of the semiconductor laser 11 and its optical output power level. FIG. 6 illustrates optical output power levels during reproducing, erasing, and recording operations, as well as on/off-states of the switches SW1 and SW2.

The reproducing optical power $P_r$ is obtained by driving the semiconductor laser with a driving current equal to $(I_1+I_2)$ or the sum of the output current $I_1$ of the voltage-to-current converter 4 that varies according to the output of the digital-to-analog converter 1 and the output current $I_2$ of the voltage-to-current converter 5 that varies according to the output of the digital-to-analog converter 2. In other words, if the switch SW1 is in the on-state (WG=$W_{GATE}$= OFF) and the switch SW2 is in the off-state (WG=WD= $W_{GATE}$=$W_{DATA}$=OFF), then the driving current becomes $I_1+I_2$ and thus the optical output power is controlled at the reproducing optical power $P_r$.

The base optical power $P_b$ is obtained by driving the semiconductor laser with the output current $I_1$ of the voltage-to-current converter 4 that varies according to the output of the digital-to-analog converter 1. That is, if the switch SW1 is in the off-state (WG=ON or $W_{GATE}$=ON) and the switch SW2 is in the off-state (WD=$W_{DATA}$=OFF), then the driving current becomes $I_1$ and thus the optical output power is controlled at the base optical power $P_b$.

The recording optical power $P_w$ is obtained by driving the semiconductor laser with a current equal to $(I_1+I_3)$ or the sum of the output current $I_1$ of the voltage-to-current converter 4 that varies according to the output of the digital-to-analog converter 1 and the output current $I_3$ of the voltage-to-current converter 6 that varies according to the output of the digital-to-analog converter 3. That is, if the switch SW1 is in the off-state (WG=ON or $W_{GATE}$=ON) and the switch SW2 is in the on-state (WD=ON or $W_{DATA}$=ON), then the driving current becomes $I_1+I_3$ and thus the optical output power is controlled at the reproducing optical power $P_w$.

Here, it is assumed that the resolution of each feedback loop or the minimum change in the current of the digital-to-analog converter produced by a one-bit change at its least significant bit is set in such a manner that the ratio of the resolution of the feedback loop a to that of the feedback loop b is N, and the ratio of the resolution of the feedback loop a to that of the feedback loop c is M. For example, if N=4 and M=1, then the ratio of the maximum value of the current $I_1$ to that of $I_2$ becomes N:1 or N=4, and the ratio of the maximum value of the current $I_1$ to that of $I_3$ becomes M:1 or M=1. In this case, if the input $D_1$ of the digital-to-analog converter 1 is changed by 1, then the output A of the analog-to-digital converter 10 will change by 4 (=N), if the input $D_2$ of the digital-to-analog converter 2 is changed by 1, then the output A of the analog-to-digital converter 10 will change by 1, and if the input $D_3$ of the digital-to-analog converter 3 is changed by 1, then the output A of the analog-to-digital converter 10 will change by 4 (=N/M).

Figure 7:
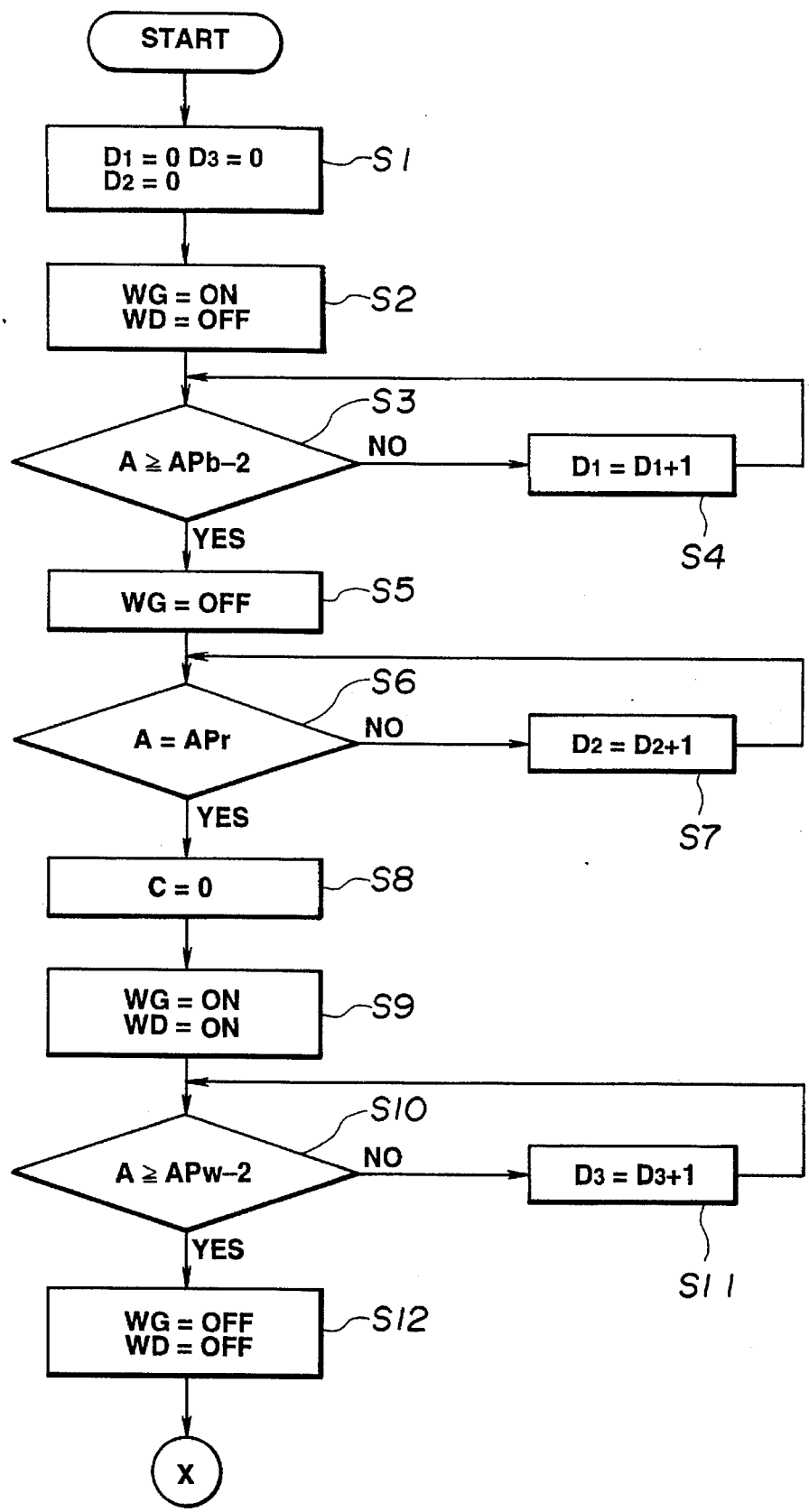
Figure 8:
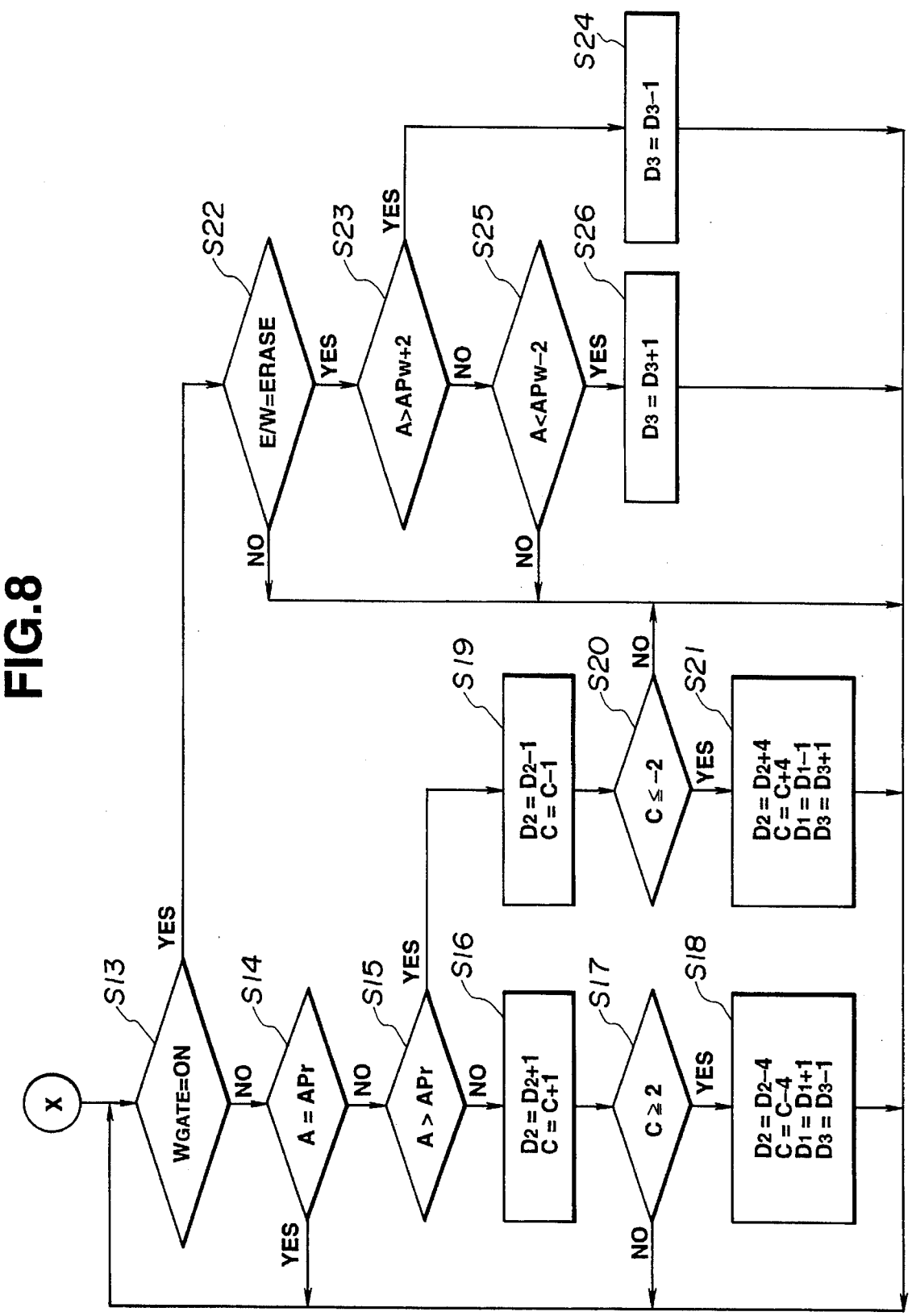

Referring to FIGS. 7 and 8, the operation of the semiconductor laser driving apparatus constructed in the above-described manner according to the present embodiment will be described below. The flow chats shown in FIGS. 7 and 8 illustrate the operation of the signal processing circuit 13.

At the beginning of an operation of driving a semiconductor laser, the signal processing circuit 13 performs initial adjustment of the optical output power of the semiconductor laser.

In step S1 of FIG. 7, the input of each digital-to-analog converter is set to 0 ($D_1$=0, $D_2$=0, $D_3$=0).

In steps S2 through S4, the base optical power $P_b$ is then adjusted. In step S2, WG is set to ON, and WD is set to OFF. In step S3, it is determined whether the output A of the analog-to-digital converter 10 is equal to or Greater than $AP_b$ minus 2 wherein $AP_b$ is a target value of the output A corresponding to the base optical power $P_b$. In step S4, the input $D_1$ of the digital-to-analog converter 1 is incremented by 1 or $D_1$=$D_1$+1 until A $AP_b$−2. In the base optical power $P_b$ mode, if $D_1$ is changed by 1, then A will change by 4. Therefore, the adjustment in these steps is performed so that the optical output power level is controlled within the range of $AP_b$ 2.

After the completion of the adjustment of the base optical power $P_b$, the reproducing optical power $P_r$ is adjusted in steps S5 through S7. In step S5, WG is set to OFF. In step S6, it is determined whether the output A of the analog-to-digital converter 10 is equal to the target value $AP_r$ of the output A corresponding to the reproducing optical power $P_r$. In step S7, the input $D_2$ of the digital-to-analog converter 2 is incremented by 1 or $D_2$=$D_2$+1 until A=$AP_r$. In the reproducing optical power $P_r$ mode, if $D_2$ is changed by 1, then A will change by 1. Therefore, the adjustment in these steps is performed so that the optical output power level is controlled at $AP_r$.

After the completion of the adjustment of the reproducing optical power $P_r$, in step S8, a value C representing the change in $D_2$ is set to 0 so that the change in $D_2$ can be determined from the value C in the following steps.

In steps S9 through S11, the recording optical power $P_w$ is adjusted. In step S9, WG is set to ON, and WD is also set to ON. In step S10, it is determined whether the output A of the analog-to-digital converter 10 is equal to or greater than $AP_w$ minus 2 wherein $AP_w$ is a target value of the output A corresponding to the recording optical power $P_w$. In step S11, the input $D_3$ of the digital-to-analog converter 3 is incremented by 1 or $D_3=D_3+1$ until A $AP_w-2$. In the recording optical power $P_w$ mode, if $D_3$ is changed by 1, then A will change by 4. Therefore, the adjustment in these steps is performed so that the optical output power level is controlled within the range of $AP_w$ 2.

In this way, the initial adjustment of the base optical power $P_b$, the reproducing optical power $P_r$, and the recording optical power $P_w$ is completed. After the completion of the initial adjustment, in step S12, WG is set to OFF, and WD is also set to OFF so that the semiconductor laser 11 is driven at the optical output power level equal to the reproducing optical power $P_r$.

After that, the semiconductor laser is controlled (in an automatic power control (APC) mode) at the reproducing optical power $P_r$, the base optical power $P_b$, or the recording optical power $P_w$ depending on the instruction output given by the recording-control signal processing circuit (not shown).

In step S13 of FIG. 8, the signal processing circuit 13 determines whether the write gate signal $W_{GATE}$ received from the recording-control signal processing circuit is $W_{GATE}$=ON thereby determining whether either a recording operation or erasing operation is being performed.

If it is concluded in step S13 that $W_{GATE}$=OFF and thus neither the recording operation nor erasing operation is being performed, then the process proceeds to step S14 so as to perform the correction of the reproducing optical power $P_r$. In step S14, it is determined whether the output A of the analog-to-digital converter 10 corresponding to the optical output power of the semiconductor laser 11 is equal to $AP_r$ corresponding to the reproducing optical power $P_r$ ($A=AP_r$). If $A=AP_r$, then the process returns to step S13. If A is not equal to $AP_r$, then in step S15 it is determined whether A is greater than $AP_r$ ($A>AP_r$).

If it is conclude in step S15 that A is not greater than $AP_r$, that is, the optical output power has decreased, then the process proceeds to step S16 in which the input $D_2$ of the digital-to-analog converter 2 is incremented by 1 or $D_2=D_2+1$ so that $I_2$ is incremented by one step thereby increasing the optical output power level, and furthermore the change C in $D_2$ is incremented by 1 or $C=C+1$. After that, in step S17, it is determined whether the change C is equal to or greater than the predetermined threshold value or 2 (=N/2). If C is less than 2, then the process returns to step S13. If C is equal to or greater than 2, then the process proceeds to step S18 in which both $D_2$ and C are decremented by 4 (=N) and the input $D_1$ of the digital-to-analog converter 1 is incremented by 1. In the above steps, when the optical output power has become lower, the reproducing optical power $P_r$ is corrected. However, the optical output power corresponding to the base optical power $P_b$ is still at a lower level. Therefore, if the value $AP_b$ corresponding to the base optical power $P_b$ becomes less by 2 than the value that has been set at the initial adjustment, both $D_2$ and C are decremented by the amount corresponding to the resolution ratio N between the feedback loops a and b, and furthermore $D_1$ is incremented by 1 so that the reproducing optical power $P_r$ is maintained at its target value, and the driving current $I_1$ for the base optical power $P_b$ is incremented by one step. As a result of the above process, $AP_b$ changes from –2 (=–N/2) to +2 (=N/2).

In this state, if $D_1$ is incremented by 1, then $I_1$ is incremented by one step, and thus the supply current $I_1+I_3$ for the recording optical power $P_w$ increases. As a result, the detected optical output power level A becomes greater than the desired value by an amount of 4. To correct that, the input $D_3$ of the digital-to-analog converter 3 is decremented by 1 (=M) so that $I_3$ is decremented by one step. Thus, the supply current $I_1+I_3$ for the recording optical power $P_w$ is maintained at the desired value. For the above reason, the process in step S18 is performed such that $D_2=D_2-4$, $C=C-4$, $D_1=D_1+1$, $D_3=D_3-1$ and thus inputs of the digital-to-analog converters 1, 2, and 3 are properly modified.

If the optical output power level decreases further, and if the reproducing optical power $P_r$ is corrected and $I_2$ is incremented by two steps and furthermore $D_2$ is incremented by 2, then the value $AP_b$ of A corresponding to the base optical power $P_b$ returns to 0 from +2.

On the other hand, if it is concluded in step S15 that A is greater than $AP_r$, that is, the optical output power level has increased, then the process proceeds to step S19 so as to execute the process in the opposite manner to that of the above process. In step S19, the input $D_2$ of the digital-to-analog converter 2 is decremented by 1 or $D_2=D_2-1$ so that $I_2$ is decremented by one step thereby decreasing the optical output power level, and furthermore the change C in $D_2$ is decremented by 1 such that $C=C-1$. After that, in step S20, it is determined whether the change C is equal to or greater than the predetermined threshold value or –2. If C is greater than –2, then the process returns to step S13. If C is equal to or less than –2, then the process proceeds to step S21 in which both $D_2$ and C are incremented by 4 and the input $D_1$ of the digital-to-analog converter 1 is decremented by 1. As a result of the above process, $AP_b$ changes from +2 to –2.

In this state, if $D_1$ is decremented by 1, then $I_1$ is decremented by one step, and thus the supply current $I_1+I_3$ for the recording optical power $P_w$ decreases. As a result, the detected optical output power level or the output A of the analog-to-digital converter A becomes less than the desired value by an amount of 4. To correct that, the input $D_3$ of the digital-to-analog converter 3 is incremented by 1 so that $I_3$ is incremented by one step. Thus, the supply current $I_1+I_3$ for the recording optical power $P_w$ is maintained at the desired value. For the above reason, the process in step S21 is performed such that $D_2=D_2+4$, $C=C+4$, $D_1=D_1-1$, $D_3=D_3+1$ and thus inputs of the digital-to-analog converters 1, 2, and 3 are properly modified.

If the optical output power level increases further, and if the reproducing optical power $P_r$ is corrected and $I_2$ is decremented by two steps and furthermore $D_2$ is decremented by 2, then the value $AP_b$ of A corresponding to the base optical power $P_b$ returns to 0 from –2.

In step S13, if it is determined that $W_{GATE}$=ON and thus either the recording operation or erasing operation is being performed, then the process proceeds to step S22 in which the signal processing circuit 13 determines whether erase/write signal E/W received from the recording-control signal processing circuit is "ERASE". If E/W="WRITE", that is, if the recording operation is being performed, then the process returns to step S13. This is because, in the recording operation, the optical output power level is switched at a high rate between the recording optical power level and the base optical power level, and therefore it is impossible to detect $P_w$ and $P_b$ accurately, and thus it is impossible to correct the optical output power level.

On the other hand, if it is concluded in step S22 that E/W="ERASE" or the erasing operation is being performed, that is, the optical output power level is at the recording optical power $P_w$, then the process proceeds to step S23 so as to perform correction of the recording optical power. In step S23, it is determined whether the output A of the analog-to-digital converter 10 is greater than the upper limit ($A>AP_w+2$ where $AP_w$ is a value of A corresponding to the recording optical power $P_w$). If it is concluded in step S23 that A is greater than the upper limit, then the process proceeds to step S24 in which $D_3$ is decremented by 1 or $D_3=D_3-1$ so that $I_3$ decreases and thus the optical output power level decreases.

Contrarily, if A is equal to or less than the upper limit, then the process proceeds to step S25 in which it is determined whether A less than the lower limit ($A<AP_w-2$). If A is equal to or greater than the lower limit, the process returns to step S13. If A is less than the lower limit, then the process proceeds to step S26 in which $D_3$ is incremented by 1 or $D_3=D_3+1$ so that $I_3$ increases and thus the optical output power level increases.

According to the above process for controlling the optical output power level, the reproducing optical power $P_r$ is controlled at a level corresponding to $AP_r$, and the variation in the base optical power $P_b$ is controlled within a range corresponding to the variation of N/2 in the output A of the analog-to-digital converter 10. In this control process, the reproducing optical power $P_r$ is corrected in such a manner that when $D_1$ and $D_2$ are changed properly depending on the change in $D_2$, the $D_3$ is also changed depending on the change in $D_1$ thereby preventing the variation in the recording optical power $P_w$ due to the variation in $D_1$. Furthermore, in the above control process, the recording optical power $P_w$ is controlled within a predetermined range by properly changing $D_3$.

Figure 9:
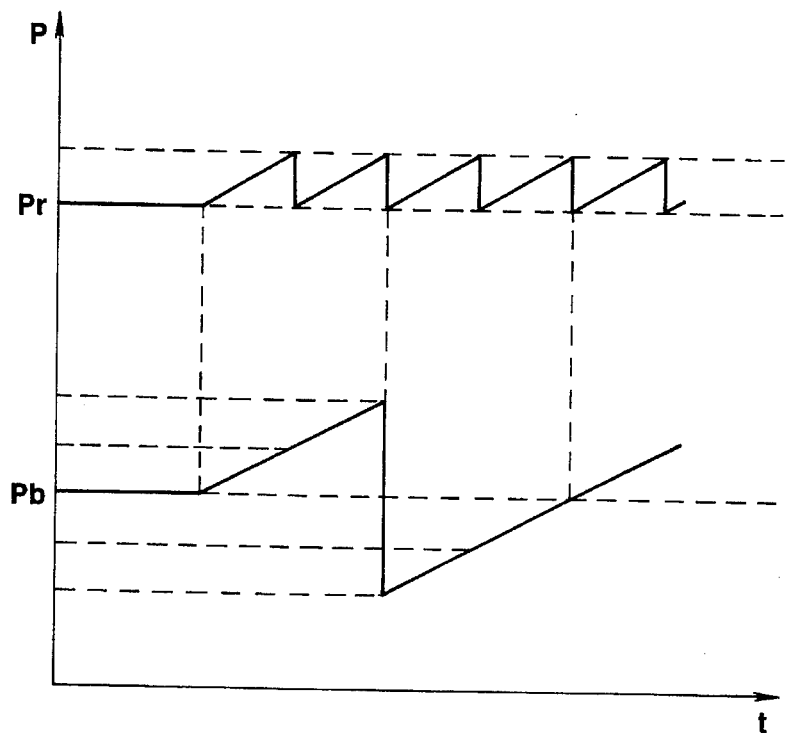

FIG. 9 illustrates a control process of the optical output power level four the case where the optical output power level of the semiconductor laser increases with time. If the reproducing optical power $P_r$ increases by a predetermined amount (that is 1 in the output A of the analog-to-digital converter 10, that corresponds to the amount of one step in P between adjacent horizontal broken lines shown in FIG. 9), then the output of the feedback loop b is decreased by one step so that the reproducing optical power $P_r$ decrease to a proper level. When the change in $D_2$ becomes equal to N/2=2 as a result of a repetition of the correction process of the optical output power level, the output (the input $D_1$ of the digital-to-analog converter 1) of the feedback loop a is decreased by one step, and the output of the feedback loop b is increased by 4 (=N). Thus, the variation in the feedback loop b is converted into the variation in the feedback loop a, whereby the reproducing optical power $P_r$ is corrected to a predetermined proper value, and the base optical power $P_b$, that has gone to an increased level as a result of the correction process for the reproducing optical power $P_r$ in which only $D_2$ was decreased, is now decreased. Since the variation in the base optical power $P_b$ is controlled within the range corresponding to the variation of N/2 in the output A of the analog-to-digital converter 10, the base optical power can be controlled more precisely than can be by conventional techniques.

Figure 10:
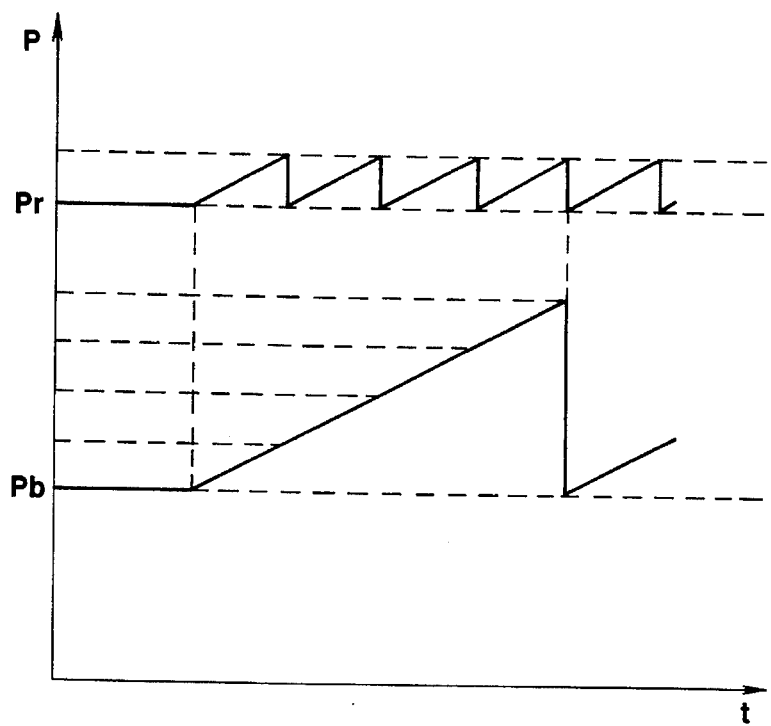
FIG. 10 illustrates, for comparison with FIG. 9, a control process of the optical output power level according to the technique shown in FIG. 2.

For comparison with FIG. 9, FIG. 10 illustrates variations in the reproducing optical power $P_r$ and the base optical power $P_b$ during the control process. In this case, when the change in the feedback loop B that controls the reproducing optical power reaches 4 (=N) steps that are equal to the ratio of the resolution of the feedback loop A to that of the feedback loop B, the change in the feedback loop B is converted into the change in the feedback loop A. Therefore, the base optical power $P_b$ is controlled within a range of N (=4).

As described above, in the semiconductor laser driving apparatus according to the present embodiment, the reproducing optical power is corrected by the feedback loops a and b wherein both feedback loops are controlled by the single signal processing circuit 13 in such a manner that the change in the feedback loop b that controls the reproducing optical power is detected, and if this change reaches about a half of the ratio of the resolution of the feedback loop a to that of the feedback loop a, then the output of the feedback loop a that controls the base optical power is changed by one step in the same direction as that in which the feedback loop b has been changed, and furthermore the output of the feedback loop b is changed by N steps in the opposite direction.

In the above control process, when the signal processing circuit 13 changes the output of the feedback loop a in response to the change in the feedback loop b, the signal processing circuit 13 also changes the output of the feedback loop c by M steps that correspond to the ratio of the resolution of the feedback loop a to that of the feedback loop c in the direction opposite to that in which the output of the feedback loop a is changed.

As described above, according to the present embodiment of the invention, the semiconductor laser driving apparatus provided with three feedback loops can produce all of the reproducing optical power, recording optical power, and base optical power required to record or reproduce information. That is, the base optical power is obtained by the output of the feedback loop a, the reproducing optical power is obtained by adding the output of the feedback loop b to the output of the feedback loop a, and the recording optical power is obtained by adding the output of the feedback loop c to the output of the feedback loop a, wherein the base optical power, the reproducing optical power, and the recording optical power can be set independently to arbitrary target values and controlled independently at the respective target values. Furthermore, the addition of the feedback loop b or the feedback loop c to the feedback loop a allows a reduction in current flowing through the feedback loop for the reproducing optical power correction or the recording optical power correction thereby improving the resolution of the feedback loop. Thus, it is possible to improve the accuracy in controlling the optical output power level for both reproducing optical power and recording optical power.

Furthermore, in the control of the reproducing optical power, the change in Current, such as the shift of the threshold current during the driving of the semiconductor laser, is corrected by both feedback loop for the base optical power correction and feedback loop for the reproducing optical power correction in such a manner that when the change in the feedback loop for the reproducing optical power correction reaches a predetermined value (a half of the ratio of the resolution of the feedback loop for the reproducing optical power correction to that of the feedback loop for the base optical power correction, that is, a half of the ratio of the output current produced by one bit at the least significant bit of the digital-to-analog converter of one feedback loop to that of the other feedback loop), the change in the feedback loop for the reproducing optical power correction is replaced with the change in the feedback loop for the base optical power correction thereby achieving better accuracy in controlling the base optical power than can be achieved in conventional techniques. Furthermore, when the above-described adjustment in the feedback loops for the base optical power and the reproducing optical power is performed, the feedback loop for the recording optical power is also adjusted so that the change in the recording optical power due to the change in the feedback loop for the base optical power correction is suppressed.

FIGS. 11 through 14 illustrate a second embodiment of the present invention.

This second embodiment is obtained by modifying the first embodiment such that the reproducing optical power $P_r$ is produced by a current equal to $(I_1-I_2)$ or the difference between the current $I_1$ of the feedback loop a and the current $I_2$ of the feedback loop b.

Figure 4:
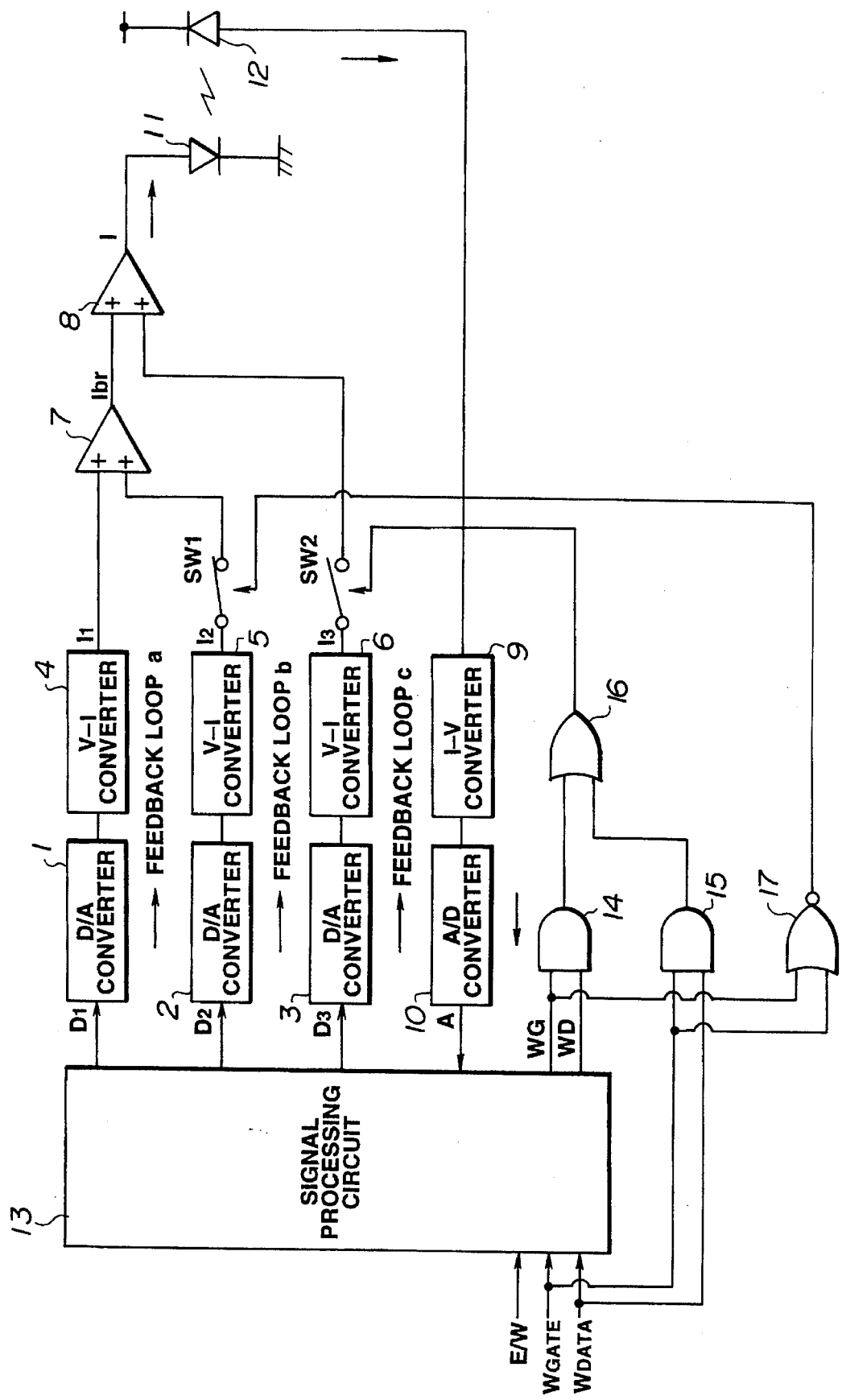
Figure 11:
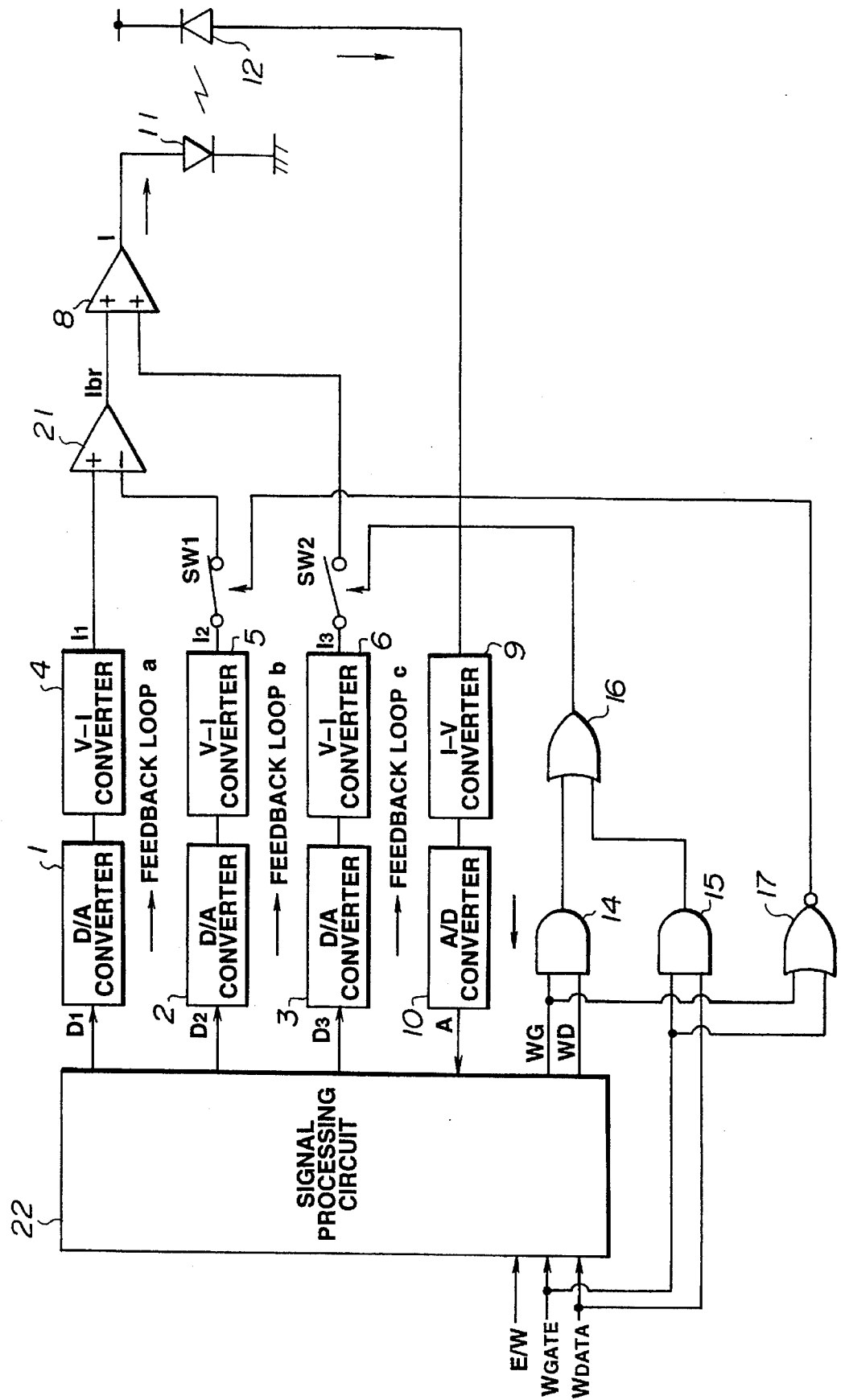

As shown in FIG. 11, the configuration of the second embodiment differs from that of the first embodiment shown in FIG. 4 in that the adder 7 is replaced by the subtractor 21 so that the subtractor 21 from the difference between the output $I_1$ of the voltage-to-current converter 4 and the output $I_2$ of the voltage-to-current converter 5. The other parts of the configuration is the same as those of the first embodiment, and therefore these parts are not described here again.

Figure 12:
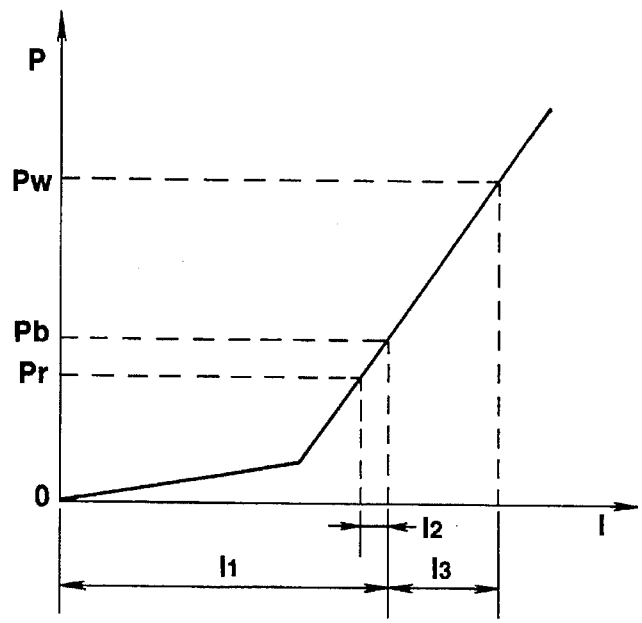
Figure 13:
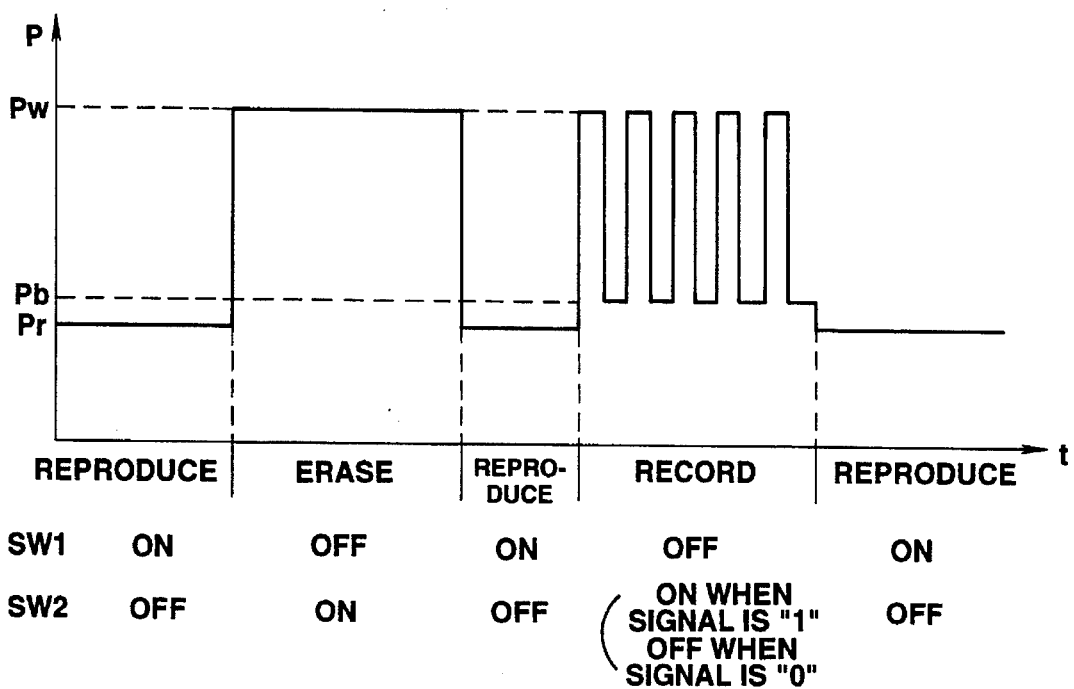

FIG. 12 illustrates the relationship between the optical output power of a semiconductor laser 11 and the driving current. FIG. 13 illustrates optical output power levels during reproducing, erasing, and recording operations, as well as on/off-states of the switches SW1 and SW2.

The reproducing optical power $P_r$ is obtained by driving the semiconductor laser with a driving current equal to $(I_1-I_2)$ or the difference between the output current $I_1$ of the voltage-to-current converter 4 that varies according to the output of the digital-to-analog converter 1 and the output current $I_2$ of the voltage-to-current converter 5 that varies according to the output of the digital-to-analog converter 2. That is, when the switch SW1 is in an on-state and the switch SW2 is in an off-state, the driving current becomes $I_1-I_2$ and thus the optical output power is controlled at the reproducing optical power level $P_r$.

The base optical power $P_b$ is obtained by driving the semiconductor laser with the output current $I_1$ of the voltage-to-current converter 4 that varies according to the output of the digital-to-analog converter 1. That is, if both switch SW1 are in the off-state, then the driving current becomes $I_1$ and thus the optical output power is controlled at the base optical power $P_b$.

Figure 14:
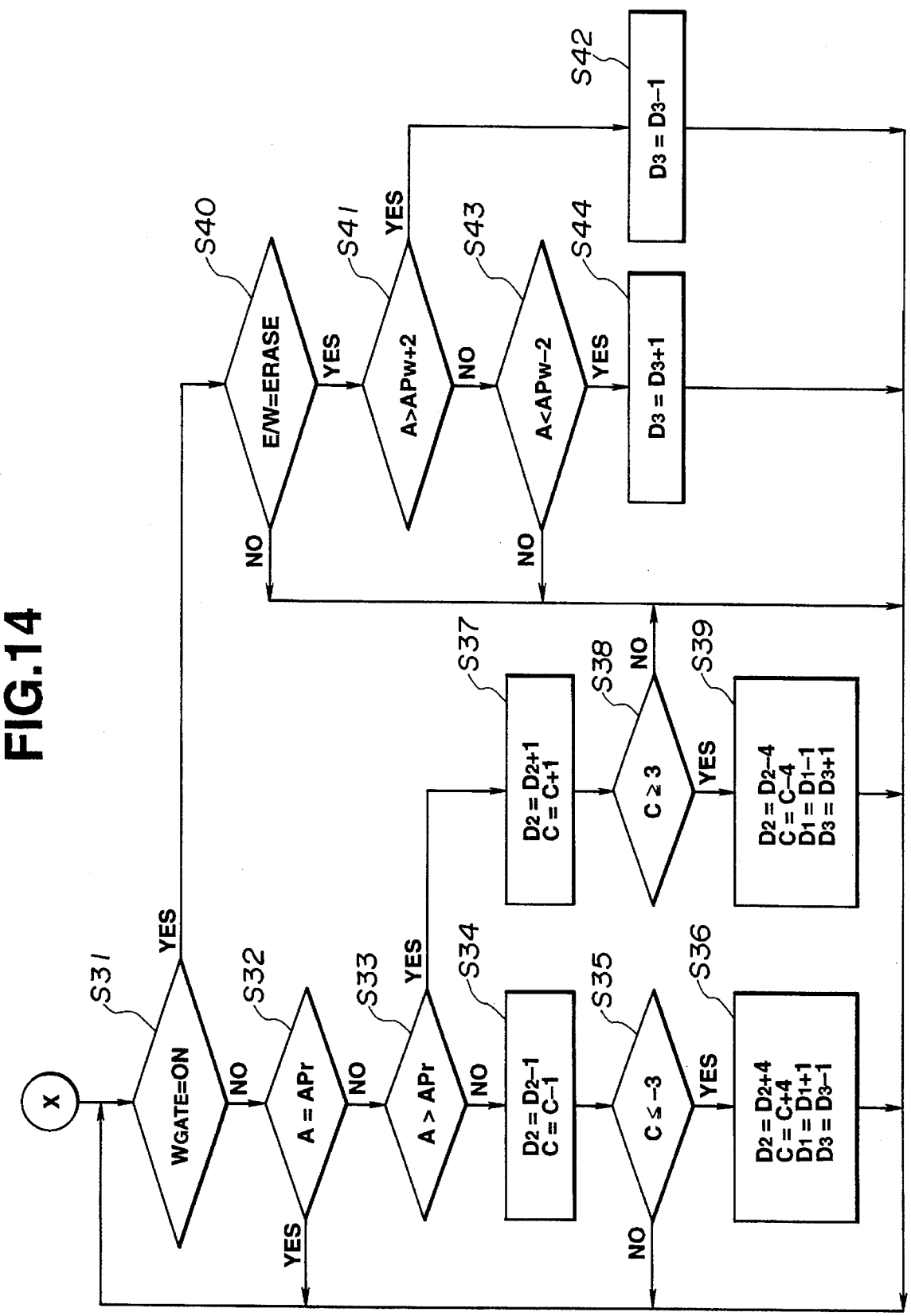

The recording optical power $P_w$ is obtained by driving the semiconductor laser with a current equal to $(I_1+I_3)$ or the sum of the output current $I_1$ of the voltage-to-current converter 4 that varies according to the output of the digital-to-analog converter 1 and the output current $I_3$ of the voltage-to-current converter 6 that varies according to the output of the digital-to-analog converter 3. That is, if the switch SW1 is in the off-state and the switch SW2 is in the on-state, then the driving current becomes $I_1+I_3$ and thus the optical output power is controlled at the reproducing optical power $P_w$. Referring to FIG. 14, the operation of the semiconductor laser driving apparatus according to the second embodiment will be described below. The flow chats shown in FIG. 14 illustrates the APC operation performed by the signal processing circuit 22 according to the present embodiment.

The initial adjustment of the optical output power level of the semiconductor laser is performed in a manner similar to that in steps S1 through S12 of the fist embodiment as shown in FIG. 7. Therefore, only processes after the initial adjustment, that is, the automatic power control (APC) process for the reproducing optical power $P_w$, the base optical power $P_b$, and the recording optical power $P_w$ are described here.

In the first embodiment, when the change in the output of the feedback loop b reaches the threshold value, that is, when the change C in $D_2$ reaches the threshold value N/2 or 2, the inputs $D_1$, $D_2$, and $D_3$ of the digital-to-analog converters 1, 2, and 3 are changed in step S18 or S21. In the second embodiment, however, the threshold value associated with the change C in the input $D_2$ of the digital-to-analog converter 2 is set to (N/2+1) or 3 so that the outputs of the digital-to-analog converters 1, 2, and 3 do not change too frequently even if the optical output power changes consecutively across the threshold value of C.

In step S31, the signal processing circuit 22 determines whether the write gate signal $W_{GATE}$ received from the recording-control signal processing circuit is $W_{GATE}$=ON thereby determining whether either a recording operation or erasing operation is being performed.

If it is concluded in step S31 that $W_{GATE}$=OFF and thus neither the recording operation nor erasing operation is being performed, then the process proceeds to step S32 so as to perform the correction of the reproducing optical power $P_r$. In step S32, it is determined whether the output A of the analog-to-digital converter 10 corresponding to the optical output power of the semiconductor laser 11 is equal to $AP_r$, corresponding to the reproducing optical power $P_r$. If A= $AP_r$, then the process returns to step S31. If A is not equal to $AP_r$, then the process proceeds to step S15 in which it is determined whether A is greater than $AP_r$.

If it is conclude in step S33 that A is not greater than $AP_r$, that is, the optical output power has decreased, then the process proceeds to step S34 in which the input $D_2$ of the digital-to-analog converter 2 is decremented by 1 or $D_2=D_2-1$ so that $I_2$ is decremented by one step thereby increasing the optical output power level, and furthermore the change C in $D_2$ is decremented by 1 or C=C-1. After that, in step S35, it is determined whether the change C is equal to or less than −3 (=−(N/2+1)). If C is larger than −3, then the process returns to step S31. If C is equal to or less than −3, then the process proceeds to step S36 in which both $D_2$ and C are incremented by 4 (=N) and the input $D_1$ of the digital-to-analog converter 1 is incremented by 1. In the above steps, if the optical output power has become lower, the reproducing optical power $P_r$ is corrected. However, the optical output power corresponding to the base optical power $P_b$ is still at a lower level. Therefore, if the value $AP_b$ corresponding to the base optical power $P_b$ becomes smaller by 3 relative to the value that has been set at the initial adjustment, both $D_2$ and C are incremented by an amount corresponding to the resolution ratio N between the feedback loops a and b, and furthermore $D_1$ is incremented by 1 so that the reproducing optical power $P_r$ is maintained at its target value, and the driving current $I_1$ for the base optical power $P_b$ is incremented by one step. As a result of the above process, $AP_b$ changes from −3 (=−(N/2+1)) to +1 (=N/2−1).

In this state, if $D_1$ is incremented by 1, then $I_1$ is incremented by one step, and thus the supply current $I_1+I_3$ for the recording optical power $P_w$ increases. As a result, the detected optical output power level A becomes greater than the desired value by an amount of 4. To correct that, the input $D_3$ of the digital-to-analog converter 3 is decremented by 1 (=M) so that $I_3$ is decremented by one step. Thus, the supply current $I_1+I_3$ for the recording optical power $P_w$ is maintained at the desired value. For the above reason, the process in step S36 is performed such that $D_2=D_2+4$, C=C+4, $D_1=D_1+1$, $D_3=D_3-1$ and thus inputs of the digital-to-analog converters 1, 2, and 3 are properly modified.

If the optical output power level decreases further, and if the reproducing optical power $P_r$ is corrected and $I_2$ is incremented by one step and $D_2$ is decremented by 1, then the value $AP_b$ of A corresponding to the base optical power $P_b$ returns to 0 from +1.

On the other hand, if it is concluded in step S22 that A is greater than $AP_r$, that is, the optical output power level has increased, then the process proceeds to step S37 so as to execute the process in the opposite manner to that in the above process. In step S37, the input $D_2$ of the digital-to-analog converter 2 is incremented by 1 or $D_2=D_2+1$ so that $I_2$ is incremented by one step thereby decreasing the optical output power level, and furthermore the change C in $D_2$ is incremented by 1 such that $C=C+1$. After that, in step S38, it is determined whether the change C is equal to or greater than 3. If C is less than 3, then the process returns to step S31. If C is equal to or greater than 3, then the process proceeds to step S39 in which both $D_2$ and C are decremented by 4 and the input $D_1$ of the digital-to-analog converter 1 is decremented by 1. As a result of the above process, $AP_b$ changes from +3 to −1.

In this state, if $D_1$ is decremented by 1, then $I_1$ is decremented by one step, and thus the supply current $I_1+I_3$ for the recording optical power $P_w$ decreases. As a result, the detected optical output power level or the output A of the analog-to-digital converter 10 becomes less than the desired value by an amount of 4. To correct that, the input $D_3$ of the digital-to-analog converter 3 is incremented by 1 so that $I_3$ is incremented by one step. Thus, the supply current $I_1+I_3$ for the recording optical power $P_w$ is maintained at the desired value. For the above reason, the process in step S39 is performed such that $D_2=D_2-4$, $C=C-4$, $D_1=D_1-1$, $D_3=D_3+1$ and thus inputs of the digital-to-analog converters 1, 2, and 3 are properly modified.

If the optical output power level increases further, and if the reproducing optical power $P_r$ is corrected and $I_2$ is incremented by one step and furthermore $D_2$ is incremented by 1, then the value $AP_b$ of A corresponding to the base optical power $P_b$ returns to 0 from −1.

In step S31, if it is determined that $W_{GATE}$=ON and thus either the recording operation or erasing operation is being performed, then the process proceeds to step S40 so as to perform correction of the recording optical power $P_w$. In steps 40 through 44, the process is performed in the same manner as in steps S22 through S26 of the first embodiment, and therefore these steps are not described here again.

According to the above process for controlling the optical output power level, the reproducing optical power $P_r$ is controlled at a level corresponding to $AP_r$, and the variation in the base optical lower $P_b$ is controlled within a range corresponding to the variation of (N/2+1) in the output A of the analog-to-digital converter 10. In this control process, as in the first embodiment, the reproducing optical power $P_r$ is corrected in such a manner that when $D_1$ and $D_2$ are changed properly depending on the change in $D_2$, the $D_3$ is also changed depending on the change in $D_1$ thereby preventing the variation in the recording optical power $P_w$ due to the variation in $D_1$.

According to the present embodiment of the invention, the semiconductor laser driving apparatus including three feedback loops can produce all of the reproducing optical power, recording optical power, and base optical power required to record or reproduce information. Thus, as in the first embodiment, it is possible to control the optical output power level for any mode independently of the other modes. Furthermore, it is possible to reduce the current flowing through each feedback loop for the reproducing optical power correction and the recording optical power correction thereby improving not only the accuracy in controlling the optical output power level for the reproducing operation and the recording operation, but also the accuracy in controlling the base optical power level.

In both embodiments described above, the ratio N of the resolution of the feedback loop for the reproducing optical power correction to that for the recording optical power correction is set such that N=4. However, N can also take another value equal to or greater than 2. Furthermore, in the above embodiments, the ratio M of the resolution of the feedback loop for the recording optical power correction to that for the base optical power correction is set such that M=1. However, M can also take another value equal to or greater than 1.

As described above in connection with specific embodiments, the present invention provides a semiconductor laser driving apparatus capable of controlling accurately all optical power levels including the recording optical power, base optical power, and reproducing optical power at respective target values required for an information recording/reproducing apparatus to record or reproduce information.

It will be apparent that various modifications and variations are possible without departing from the spirit and scope of the invention. It is to be understood that the invention is not limited to the specific embodiments except as defined in the appended claims.

What is claimed is:

1. A semiconductor laser driving apparatus for use in an information recording/reproducing apparatus that records and reproduces information by illuminating a recording medium with a laser beam, said semiconductor laser driving apparatus comprising:

a semiconductor laser for generating said laser beam;

a photo detector for detecting the output of said semiconductor laser;

a first current source for generating a base optical power of the output of said semiconductor laser wherein said base optical power is used in recording information;

a second current source for adjusting a reproducing optical power of the output of said semiconductor laser wherein said reproducing optical power is used to reproduce information;

a third current source for adjusting a recording optical power of the output of said semiconductor laser wherein said recording optical power is used to record information; and optical power control means for controlling the optical output power of said semiconductor laser, wherein the reproducing optical power used to reproduce information is generated by the sum of a first current provided by the first current source and a second current provided by the second current source, wherein the recording optical power used to record information is generated by the sum of the first current provided by the first current source and a third current provided by the third current source, and wherein the base optical power used in recording information is generated by the first current provided by the first current source.

2. A semiconductor laser driving apparatus according to claim 1, wherein:

the ratio of the output of said first current source to the output of said second current source is set to N:1 (where N is an integer equal to or greater than 2); and said optical power control means is adapted such that when the output of said second current source has been incremented or decremented by K steps (where K is an integer satisfying 1 K<N) wherein K is a threshold number in the variation corresponding to about a half of said output ratio N, the output of said second current source is changed by N steps in the direction opposite to that in which the output of said second current source has been changed, and the output of said first current source is changed one step in the same direction as said direction in, which the output of said second current source has been changed.

3. A semiconductor laser driving apparatus according to claim 2, wherein said threshold number K in the variation of the output of said second current source is an integer approximately equal to N/2.

4. A semiconductor laser driving apparatus according to claim 2, wherein said threshold number K in the variation of the output of said second current source is an integer approximately equal to N/2+1.

5. A semiconductor laser driving apparatus according to claim 1, wherein:

the ratio of the output of said first current source to the output of said third current source is set to M:1 (where M is an integer equal to or greater than 1); and said optical power control means is adapted such that when the output of said first current source has been incremented or decremented by one step, the output of said third current source is changed by M steps in the direction opposite to that in which the output of said first current source has been changed.

6. A semiconductor laser driving apparatus according to claim 1, wherein:

the ratio of the output of said first current source to the output of said second current source is set to N:1 (where N is an integer equal to or greater than 2);

the ratio of the output of said first current source to the output of said third current source is set to M:1 (where M is an integer equal to or greater than 1); and said optical power control means is adapted such that when the output of said second current source has been incremented or decremented by K steps (where K is an integer satisfying the relation 1<K<N) wherein K is a threshold number in the variation corresponding to about a half of said output ratio N, the output of said second current source is changed by N steps in the direction opposite to that in which the output of said second current source has been changed, and the output of said first current source is changed one step in the same direction as said direction in which the output of said second current source has been changed, and furthermore the output of said third current source is changed by M steps in the direction opposite to that in which the output of said first current source has been changed.

7. A semiconductor laser driving apparatus for use in an information recording/reproducing apparatus that records and reproduces information by illuminating a recording medium with a laser beam, said semiconductor laser driving apparatus comprising:

a semiconductor laser for generating said laser beam;

a photo detector for detecting the output of said semiconductor laser;

a first current source for generating a base optical power of the output of said semiconductor laser wherein said base optical power is used in recording information;

a second current source for adjusting a reproducing optical power of the output of said semiconductor laser wherein said reproducing optical power is used to reproduce information;

a third current source for adjusting a recording optical power of the output of said semiconductor laser wherein said recording optical power is used to record information; and optical power control means for controlling the optical output power of said semiconductor laser, wherein the reproducing optical power used to reproduce information is generated by a difference current equal to the difference between a first current provided by the first current source and a second current provided by the second current source, wherein the recording optical power used to record information is generated by the sum of the first current provided by the first current source and a third current provided by the third current source, and wherein the base optical power used in recording information is generated by the first current provided by the first current source.

8. A semiconductor laser driving apparatus according to claim 7, wherein:

the ratio of the output of said first current source to the output of said second current source is set to N:1 (where N is an integer equal to or greater than 2); and said optical power control means is adapted to when the output of said second current source has been incremented or decremented by K steps (where K is an integer satisfying the relation 1<K<N) wherein K is a threshold number in the variation corresponding to about a half of said output ratio N, the output of said second current source is changed by N steps in the direction opposite to that in which the output of said second current source has been changed, and the output of said first current source is changed one step in the same direction as said direction in which the output of said second current source has been changed.

9. A semiconductor laser driving apparatus according to claim 8, wherein said threshold number K in the variation of the output of said second current source is an integer equal to N/2 or an integer close to N/2.

10. A semiconductor laser driving apparatus according to claim 8, wherein said threshold number K in the variation of the output of said second current source is an integer equal to N/2+1 or an integer close to N/2+1.

11. A semiconductor laser driving apparatus according to claim 7, wherein:

the ratio of the output of said first current source to the output of said third current source is set to M:1 (where M is an integer equal to or greater than 1); and said optical power control means is adapted such that when the output of said first current source has been incremented or decremented by one step, the output of said third current source is changed by M steps in the direction opposite to that in which the output of said first current source has been changed.

12. A semiconductor laser driving apparatus according to claim 7, wherein:

the ratio of the output of said first current source to the output of said second current source is set to N:1 (where N is an integer equal to or greater than 2);

the ratio of the output of said first current source to the output of said third current source is set to M:1 (where M is an integer equal to or greater than 1); and said optical power control means is adapted such that when the output of said second current source has been incremented or decremented by K steps (where K is an integer satisfying the relation 1<K<N) wherein K is a threshold number in the variation corresponding to about a half of said output ratio N, the output of said second current source is changed by N steps in the direction opposite to that in which the output of said second current source has been changed, and the output of said first current source is changed one step in the same direction as said direction in which the output of said second current source has been changed, and furthermore the output of said third current source is changed by M steps in the direction opposite to that in which the output of said first current source has been changed.

13. A semiconductor laser driving apparatus for use in an information recording/reproducing apparatus that records and reproduces information by illuminating a recording medium with a laser beam, said semiconductor laser driving apparatus comprising:

a semiconductor laser for generating said laser beam;

a photo detector for detecting the output of said semiconductor laser;

a first current source for generating a base optical power of the output of said semiconductor laser wherein said base optical power is used in recording information;

a second current source for adjusting a reproducing optical power of the output of said semiconductor laser wherein said reproducing optical power is used to reproduce information;

a third current source for adjusting a recording optical power of the output of said semiconductor laser wherein said recording optical power is used to record information;

wherein the ratio of the output of said first current source to the output of said second current source is set to N:1 (where N is an integer equal to or greater than 2), and the ratio of the output of said first current source to the output of said third current source is set to M:1 (where M is an integer equal to or greater than 1); and optical power control means for performing fine adjustment of said reproducing optical power in such a manner than when the output of said second current source has been incremented or decremented by a predetermined amount, the output of said second current source is changed by N steps in the direction opposite to that in which the output of said second current source has been changed, and the output of said first current source is changed by one step in the direction opposite to that in which the output of said second current source has been changed by N steps thereby replacing the change in the output of said second current source by the change in the output of said first current source, and furthermore, in response to the change in the output of the first current source, the output of said third current source is changed by M steps in the direction opposite to that in which the output of said first current source has been changed.

* * * * *